United States Patent [19]
Ikai et al.

[11] Patent Number: 5,272,454
[45] Date of Patent: Dec. 21, 1993

[54] DIGITAL FM MODULATOR USING DIRECT DIGITAL SYNTHESIZER

[75] Inventors: Isao Ikai; Masatoshi Hamada; Yasuhiro Hasimoto; Yoshio Tachioka; Makoto Ishii, all of Tokyo, Japan

[73] Assignees: NEC Corporation; Nippon Hoso Kyokai, Japan

[21] Appl. No.: 930,759

[22] Filed: Aug. 14, 1992

[30] Foreign Application Priority Data

Aug. 14, 1991 [JP] Japan .................................. 3-204157

[51] Int. Cl.$^5$ .............................................. H03C 3/02
[52] U.S. Cl. ..................................... 332/117; 375/44; 455/110
[58] Field of Search ............... 332/100, 101, 102, 117; 375/44, 45, 62, 65; 455/42, 110

[56] References Cited

U.S. PATENT DOCUMENTS 4,878,035 10/1989 Vendely et al. ..................... 332/101

FOREIGN PATENT DOCUMENTS 0266903 11/1987 Japan .
2234652 2/1991 United Kingdom .

*Primary Examiner*—Siegfried H. Grimm
*Attorney, Agent, or Firm*—Ostrolenk, Faber, Gerb & Soffen

[57] ABSTRACT

A digital FM modulator includes an A/D converter, a multiplier, an adder, a direct digital synthesizer, and an addition data output circuit. The A/D converter digitally encodes an input modulation signal. The multiplier multiplies an output from the A/D converter and multiplication data input from an external circuit. The adder adds output data from the multiplier to addition data. The direct digital synthesizer changes an oscillation frequency on the basis of output data from the adder with respect to a reference frequency of a reference oscillator. The addition data output circuit changes the addition data to prevent a center frequency from changing in accordance with the multiplication data and outputs the addition data.

4 Claims, 2 Drawing Sheets

DIGITAL FM MODULATOR USING DIRECT DIGITAL SYNTHESIZER

BACKGROUND OF THE INVENTION

The present invention relates to a digital FM modulator and, more particularly, to a digital FM modulator used for transmitting digital data including a television signal and an audio signal with an FM modulation wave.

In a conventional digital FM modulator, as described in Japanese Patent Laid-Open No. 62-266903, a modulation index of a digitized modulation signal is designated by external multiplication data, and a center frequency is set by addition data. FIG. 2 shows an arrangement of the conventional digital FM modulator. In FIG. 2, a modulation signal input to a modulation signal input terminal 11 is digital/analog-converted by an A/D converter 1 and input to one terminal of a multiplier 2. Multiplication data 13 is input to the other input terminal of the multiplier 2 and multiplied by an output from the A/D converter 1, and the data is output from the multiplier 2 and input to one input terminal of an adder 3. Addition data 14 is input to the other input terminal of the adder 3 and added to an output from the multiplier 2, and the data is output from the adder 3 and input to a direct digital synthesizer (to be referred to as a DDS hereinafter) 4. The DDS 4 integrates data input to the DDS 4 every output period of a reference oscillator 5. The integrated data is used as a phase amount to obtain a sine wave from an output terminal 12. FIG. 3 shows the DDS 4. The DDS 4 includes an accumulator 40 and a ROM 43. The accumulator 40 includes an adder 41 using an output from the adder 3 as an input and a delay circuit 42 for delaying an output from the adder 41 to be fed back to the adder 41. The ROM 43 uses an output from the adder 41 as an address input. The adder 41 adds the output from the adder 3 to an output from the delay circuit 42 delayed for one period every sampling period and outputs the resultant value to the ROM 43 as an address signal. For example, when an output from the adder 3 is set to be N, a value obtained by accumulating N to the output data from the adder 3 is output as an f signal every sampling period. The ROM 43 stores Sine wave data at consecutive addresses starting from address 0 and is accessed in response to the address signal of the f signal output from the accumulator 40 so as to output the Sine wave data having an output frequency F. The DDS 4 is described in the above prior art. In this manner, the DDS 4 is operated with reference to the output frequency of the reference oscillator 5, thereby obtaining a frequency proportional to the content of the output data from the adder 3. Therefore, an FM modulation wave can be obtained from the output terminal 12, and the maximum frequency deviation and center frequency of the FM modulation wave are set by the multiplication data 13 and the addition data 14, respectively.

In the above conventional digital FM modulator, when the multiplication data is changed to change the maximum frequency deviation, not only the maximum frequency deviation but also the center frequency are changed. For this reason, the addition data must be set again.

SUMMARY OF THE INVENTION

It is an object of the present invention to provide a digital FM modulator in which a center frequency need not be set again even when a maximum frequency deviation is changed.

In order to achieve the above object, according to the present invention, there is provided a digital FM modulator comprising A/D converting means for digitally coding an input modulation signal, multiplying means for multiplying an output from the A/D converting means and multiplication data input from an external circuit, adding means for adding output data from the multiplying means to addition data, a direct digital synthesizer for changing an oscillation frequency on the basis of output data from the adding means with respect to a reference frequency of a reference oscillator, and addition data output means for changing the addition data to prevent a center frequency from changing in accordance with the multiplication data, thereby outputting the addition data.

DESCRIPTION OF THE PREFERRED EMBODIMENT

Figure 1:
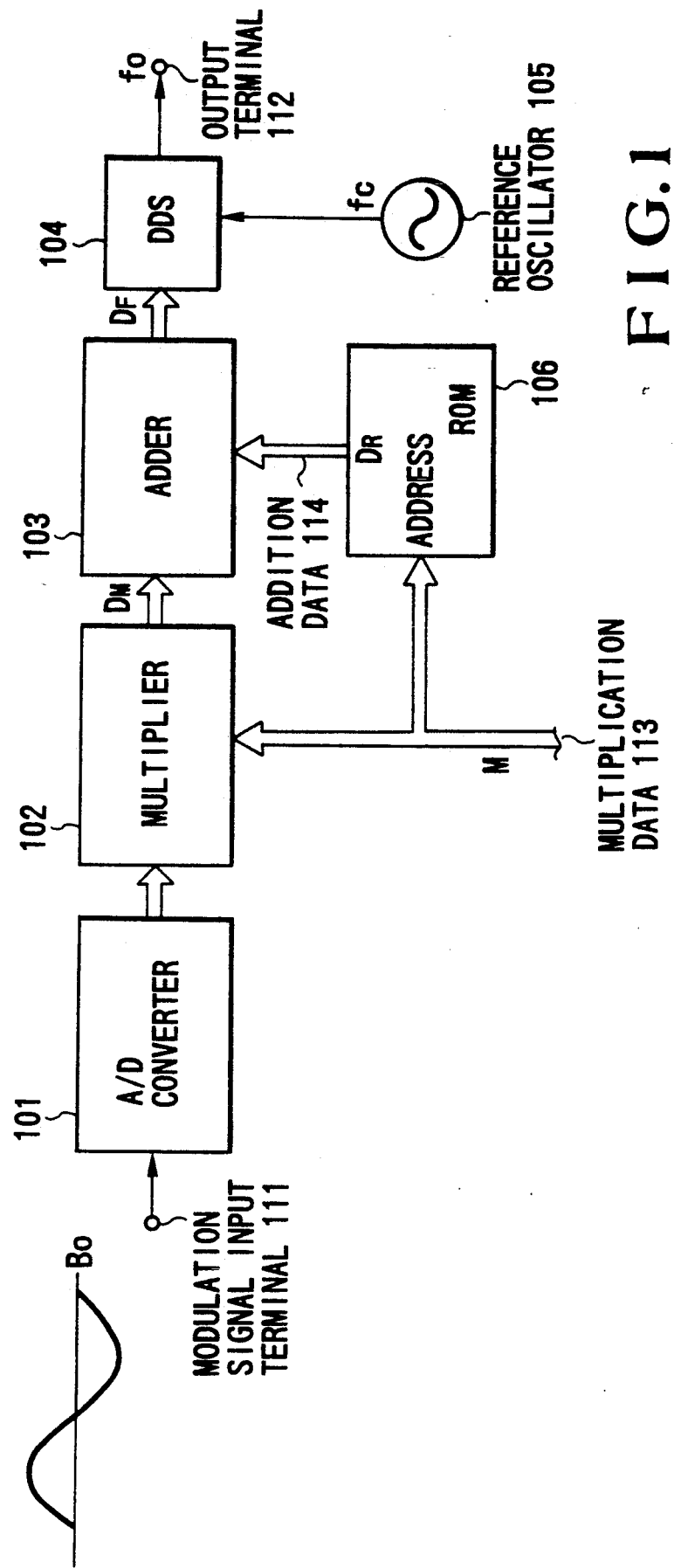
FIG. 1 is a block diagram showing a digital FM modulator according to an embodiment of the present invention.
Figure 2:
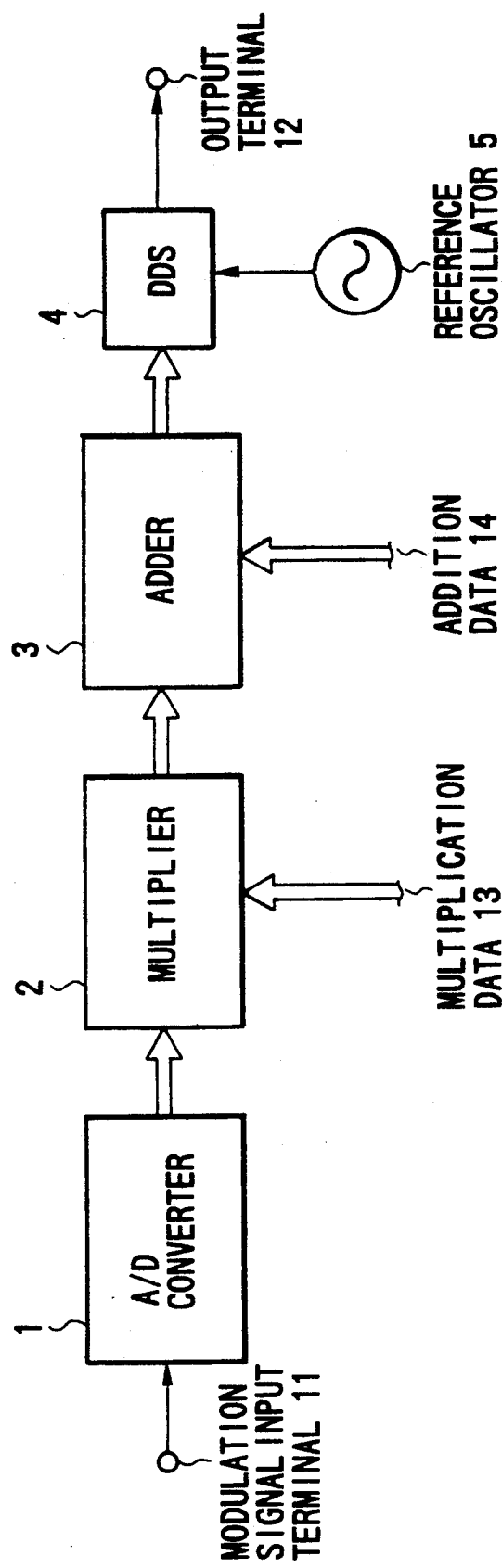
FIG. 2 is a block diagram showing a conventional digital FM modulator.

The present invention will be described below. FIG. 1 shows an embodiment of the present invention. In FIG. 1, reference numeral 101 denotes an A/D converter for A/D-converting a modulation signal input to a modulation signal input terminal 111; 102, a multiplier for multiplying an output from the A/D converter 101 and multiplication data 113; 103, an adder for adding output data $D_M$ from the multiplier 102 and addition data 114; 104, a DDS, having the same arrangement as that of FIG. 3, for receiving output data $D_F$ from the adder 103 and an output $f_C$ from a reference oscillator 105 as inputs and outputting a sine wave of a frequency $f_O$ to an output terminal 112; and 106, a ROM in which the plurality of addition data 114 corresponding to the multiplication data 113 to be changed are stored in advance. The ROM 106 outputs the addition data 114 which are read out by using the multiplication data 113 as an address input to the adder 103.

Data $D_R$ stored in the ROM 106 is set as follows. When a value of the multiplication data 113 for setting a maximum frequency deviation and a center value of modulation signal input data are represented by M and $B_O$, respectively, and the center value $B_O$ is input, the output data $D_M$ from the multiplier 102 is given by the following equation:

$$D_M = MB_O$$

Figure 3:
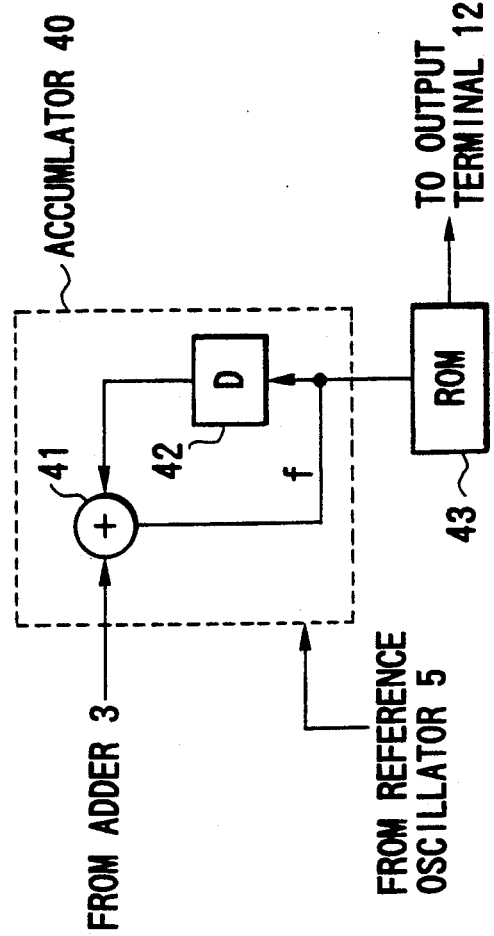
FIG. 3 is a view showing an arrangement of a known direct digital synthesizer shown in FIG. 2.

On the other hand, when the number of bits of the output of an accumulator in the DDS 104, i.e., the accumulator 40 shown in FIG. 3, is represented by n, the following data is required to output a desired output frequency $f_O$:

$$D_F = f_O/f_C 2^n$$

where $f_C$ is the frequency of the reference oscillator 105. Therefore, when data $D_R$ stored in the ROM 106 is set to be $D_F$ to $D_M$, an output frequency at the center value $B_O$ can be set to be $F_O$. That is, the data $D_R$ can be expressed as:

$$\begin{cases} D_R = D_F - D_M \\ \phantom{D_R} = D_F - M \cdot B_O \end{cases}$$

for $D_F = f_O/F_C \cdot 2^n$ where M represents the value of the multiplication data 113, i.e., an address in the ROM 106. The data $D_R$ is calculated by the equation on the basis of the value M of the multiplication data 113 and stored in the ROM 106.

An operation of a digital FM modulator according to the present invention will be described below. A modulation signal input to the modulation signal input terminal 111 is input to the A/D converter 101 and analog/digital-converted to be input to one input terminal of the multiplier 102. The multiplication data 113 from an external circuit is input to the other input terminal of the multiplier 102 to be multiplied by an output from the A/D converter 101. The output data $D_M$ from the multiplier 102 is input to one input terminal of the adder 103.

The multiplication data 113 is also input at an address of the ROM 106. The ROM 106 stores the addition data 114 corresponding to multiplication data in advance. The addition data 114 is stored such that the data $D_R$ in which a center frequency is not changed even when the multiplication data 113 is changed is calculated in advance. The output data $D_R$ from the ROM 106 is input to the other input terminal of the adder 103 as the addition data 114.

The adder 103 adds the output data $D_M$ from the multiplier 102 to the addition data 114 and inputs the resultant value to the DDS 104. The DDS 104 is operated on the basis of the output frequency $f_C$ of the reference oscillator 105 and determines the frequency $f_O$ in accordance with the output data $D_F$ from the adder 103.

In this manner, an FM modulation wave can be obtained from the output terminal 112.

As described above according to the present invention, even when a maximum frequency deviation is changed, a center frequency can be controlled in synchronization with the change in maximum frequency deviation. For this reason, the center frequency need not be set again.

What is claimed is:

1. A digital FM modulator comprising:
   A/D converting means for digitally coding an input modulation signal;
   multiplying means for multiplying an output from said A/D converting means and multiplication data input from an external circuit;
   adding means for adding output data from said multiplying means to addition data;
   a direct digital synthesizer for changing an oscillation frequency on the basis of output data from said adding means with respect to a reference frequency of a reference oscillator; and
   addition data output means for changing the addition data to prevent a center frequency from changing in accordance with the multiplication data, thereby outputting the addition data.

2. A modulator according to claim 1, wherein said addition data output means is a first memory in which addition data corresponding to the multiplication data is stored.

3. A modulator according to claim 2, wherein the multiplication data is input to said memory as address data and reads out and outputs the corresponding addition data.

4. A modulator according to claim 1, wherein said direct digital synthesizer comprises accumulating means for calculating a cumulative value of output data from said adding means, and a second memory in which trigonometrical function values are stored in an address order in advance and the trigonometrical function values are read out at intervals designated by outputs from said accumulating means.

* * * * *